US008455365B2

(12) United States Patent
Guo et al.

(10) Patent No.: US 8,455,365 B2
(45) Date of Patent: Jun. 4, 2013

(54) SELF-ALIGNED CARBON ELECTRONICS WITH EMBEDDED GATE ELECTRODE

(76) Inventors: Dechao Guo, Fishkill, NY (US); Shu-Jen Han, Cortlandt Manor, NY (US); Keith Kwong Hon Wong, Wappingers Falls, NY (US); Jun Yuan, Fishkill, NY (US)

(*) Notice: Subject to any disclaimer, the term of this patent is extended or adjusted under 35 U.S.C. 154(b) by 118 days.

(21) Appl. No.: 13/111,615

(22) Filed: May 19, 2011

(65) Prior Publication Data
US 2012/0292602 A1 Nov. 22, 2012

(51) Int. Cl.
*H01L 21/302* (2006.01)
*H01L 21/461* (2006.01)

(52) U.S. Cl.
USPC ........... 438/745; 438/424; 438/680; 438/456; 257/E21.006; 257/E21.051; 257/E21.126; 257/E21.127; 257/E21.17; 257/E21.218; 257/E21.229; 257/E21.267; 257/E21.304

(58) Field of Classification Search
USPC ............... 438/745, 680, 456, 424, 270, 700, 438/9, 311, 692, 603, 604, 775, 786, 787; 257/E21.006, E21.051, E21.17, E21.126, 257/E21.127, E21.229, E21.267, E21.304
See application file for complete search history.

(56) References Cited

U.S. PATENT DOCUMENTS

| | | | |
|---|---|---|---|
| 6,891,227 B2 * | 5/2005 | Appenzeller et al. ......... | 257/346 |
| 7,492,015 B2 | 2/2009 | Chen et al. | |
| 7,714,386 B2 * | 5/2010 | Pesetski et al. ............... | 257/347 |
| 7,829,883 B2 | 11/2010 | Furukawa et al. | |
| 7,911,831 B2 | 3/2011 | Rueckes et al. | |
| 2007/0007571 A1 | 1/2007 | Lindsay et al. | |
| 2008/0293228 A1 | 11/2008 | Kalburge | |
| 2009/0032804 A1 | 2/2009 | Kalburge | |
| 2009/0236675 A1 | 9/2009 | Yang et al. | |
| 2010/0102371 A1 | 4/2010 | Yeom | |
| 2011/0114919 A1 | 5/2011 | Jenkins et al. | |

OTHER PUBLICATIONS

Patent Cooperation Treaty. "Notification of Transmittal of the International Search Report and the Written Opinion of the International Search Authority, or the Declaration" Issued for PCT/US2012/038493 on Aug. 17, 2012. (15 Pages).
Chen, J., et al. "Self-Aligned Carbon Nanotube Transistors With Charge Transfer Doping" Applied Physics Letters 86, Mar. 2005. (3 Pages).
Franklin, A., et al. "Can Carbon Nanotube Transistors Be Scaled Without Performance Degradation?" 2009 IEEE International Electron Devices Meeting (IEDM 2009). Dec. 2009. pp. 561-564.
Han, S., et al. "Wafer Scale Fabrication of Carbon Nanotube FETs With Embedded Poly-Gates" 2010 IEEE International Electron Devices Meeting (IEDM 2010). Dec. 2010. pp. 206-209.

(Continued)

*Primary Examiner* — David Nhu
(74) *Attorney, Agent, or Firm* — Tutunjian & Bitetto, P.C.; Vazken Alexanian

(57) ABSTRACT

A device and method for device fabrication includes forming a buried gate electrode in a dielectric substrate and patterning a stack that includes a high dielectric constant layer, a carbon-based semi-conductive layer and a protection layer over the buried gate electrode. An isolation dielectric layer formed over the stack is opened to define recesses in regions adjacent to the stack. The recesses are etched to form cavities and remove a portion of the high dielectric constant layer to expose the carbon-based semi-conductive layer on opposite sides of the buried gate electrode. A conductive material is deposited in the cavities to form self-aligned source and drain regions.

18 Claims, 5 Drawing Sheets

OTHER PUBLICATIONS

Javey, A., et al. "Self-Aligned Ballistic Molecular Transistors and Electrically Parallel Nanotube Arrays" Nano Letters, vol. 4, No. 7. May 2004. pp. 1319-1322.

Meric, I., et al. "Graphene Field-Effect Transistors Based on Boron Nitride Gate Dielectrics" 2010 IEEE International Electron Devices Meeting (IEDM 2010). Dec. 2010. (4 Pages).

* cited by examiner

SELF-ALIGNED CARBON ELECTRONICS WITH EMBEDDED GATE ELECTRODE

BACKGROUND

1. Technical Field

The present invention relates to electronic devices and more particularly to devices and fabrication methods with self-aligned active regions.

2. Description of the Related Art

The semiconductor industry has been able to improve the performance of electronic systems by making ever-smaller devices. However, this approach has encountered technical limits giving rise to alternative device designs and technologies. One technology includes the use of carbon nanotubes (CNT) and, more recently, graphene layers and nanoribbons. Field-effect transistors based on semiconductor nanotubes and graphene nanoribbons may be used as high-performance devices.

The fabrication field-effect transistors may include a single-wall carbon nanotube connected to two metal electrodes. By applying a voltage to a gate electrode, the nanotube can be switched from a conducting to an insulating state. However, carbon based transistor devices often suffer from adhesion issues between carbon material and high dielectric constant (high-k) insulation materials. This is of particular concern in the formation of gate structures that often include both carbon conductors and the high-k materials. In addition, transistor designs suffer from alignment issues, which act as a barrier to reducing node sizes for future designs.

SUMMARY

A device and method for device fabrication includes forming a buried gate electrode in a dielectric substrate and patterning a stack comprising a high dielectric constant layer, a carbon-based layer and a protection layer over the buried gate electrode. An isolation dielectric layer formed over the stack is opened to define recesses in regions adjacent to the stack. The recesses are etched to form cavities and remove a portion of the high dielectric constant layer to expose the carbon-based layer on opposite sides of the buried gate electrode. A conductive material is deposited in the cavities to form self-aligned source and drain regions.

A method for device fabrication includes forming a recess through a first dielectric material of a substrate and into a second dielectric material of the substrate; forming a dielectric spacer in the recess; depositing a gate electrode conductor over the spacer in the recess; planarizing the gate electrode conductor and the dielectric spacer to remove access materials above the recess to form a buried gate electrode in the substrate; forming a stack comprising a high dielectric constant layer, a carbon-based layer and a protection layer; employing a lithographic process to form an etch mask and etching the stack to provide a portion of the stack over the buried gate electrode; opening an isolation dielectric layer formed over the stack to define recesses in regions adjacent to the stack; etching the recesses to form cavities and remove a portion of the high dielectric constant layer to expose the carbon-based layer on opposite sides of the buried gate electrode; and depositing a conductive material in the cavities to form self-aligned source and drain regions by employing atomic layer deposition to form the conductive material in contact with the carbon-based semi-conducting layer.

A transistor device includes a dielectric substrate comprising a first dielectric layer formed on a second dielectric layer. A buried gate electrode is formed in the dielectric substrate, and a stack comprising a high dielectric constant layer, a carbon-based layer and a protection layer is formed over the buried gate electrode. An isolation dielectric layer defines recesses in regions adjacent to the stack which extend through the first dielectric layer down to the second dielectric layer. Cavities associated with the recesses are formed on opposite sides of the buried gate electrode in the first dielectric layer. Self-aligned source and drain conductors are formed in the cavities and in contact with an exposed portion of the carbon-based layer facing the cavities.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
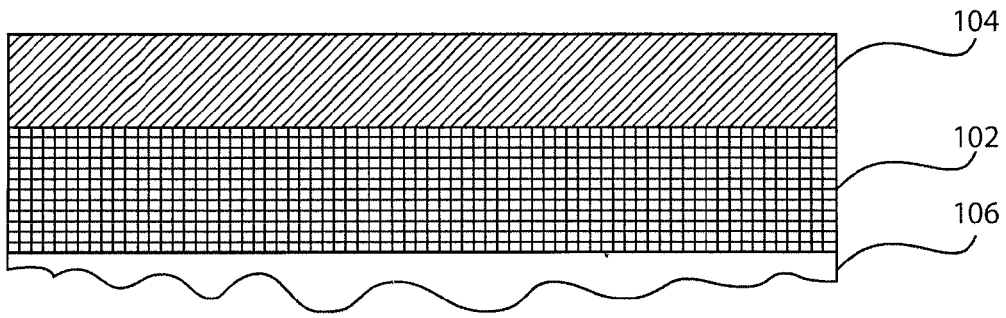
FIG. 1 is cross-sectional view of a dielectric substrate having two dielectric layers in accordance with one embodiment.

In accordance with the present principles, illustrative fabrication methods and device designs are provided which permit the formation of an interface between high-dielectric constant materials and carbon-based field effect materials. Further, the methods and device structures provide self-aligned sources and drain regions especially useful in designs employing a bottom gate. The self-aligned nature of the source and drain regions improves reliability and enables scalability as the self-alignment will be an important factor in reducing device size for future design generations.

In one embodiment, a bottom electrode is formed with a gate dielectric formed on a gate conductor. A carbon based layer is formed on the gate dielectric and a cap layer is formed on the carbon based layer. The carbon based layer, the gate dielectric and the cap layer are patterned over the gate conductor. Cavities are formed on the sides of the gate structure. Source and drain regions are formed in the cavities on the sides of the gate structure. The cavities are self-aligned to the gate structure such that when a metal/conductive material is formed in the cavities the source and drain regions are correctly aligned relative to each other, to the carbon based material and to the gate structure.

In the following description, numerous specific details are set forth, such as particular structures, components, materials, dimensions, processing steps and techniques, to provide a thorough understanding of the present principles. However, it will be appreciated by one of ordinary skill in the art that these specific details are illustrative and should not be construed as limiting.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It is to be further understood that the present invention will be described in terms of a given illustrative architecture on a wafer or substrate; however, other architectures, structures, substrate materials and process features and steps may be varied within the scope of the present invention.

Circuits or structures as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be noted that, in some alternative implementations, the functions noted in the blocks of the FIGs. may occur out of the order noted in the figures. For example, two blocks shown in succession may, in fact, be executed substantially concurrently, or the blocks may sometimes be executed in the reverse order, depending upon the functionality involved.

Referring now to the drawings in which like numerals represent the same or similar elements and initially to FIG. 1, a substrate 100 includes two layers 102 and 104. Layers 102 and 104 are preferably dielectric layers and are capable of being etched selectively relative to each other. In one embodiment, the layers 102 and 104 include an oxide and a nitride, and more particularly a silicon oxide and a silicon nitride, although other dielectric materials may be employed, e.g., organic dielectrics and the like. In the embodiment described, layer 102 includes a nitride and layer 104 includes an oxide.

It should be understood that layers 102 and 104 may be formed on a substrate 106 or other support structure. The substrate 106 may include an electrically semiconducting material, an insulating material, a conductive material, devices or structures made of these materials or any combination thereof. When the substrate 106 is comprised of a semiconducting material, any semiconductor such as Si, SiGe, SiGeC, SiC, Ge alloys, GaAs, InAs, InP and other III/V or II/VI compound semiconductors, or organic semiconductors may be employed. The substrate 106 may also be a flexible substrate including devices that are suitable for high-speed roll-to-roll processing. In addition to these listed types of semiconducting materials, substrate 106 may also be a layered semiconductor such as, for example, Si/SiGe, Si/SiC, silicon-on-insulators (SOIs) or silicon germanium-on-insulators (SGOIs). These semiconductor materials may form a device, or devices or structures, which may be discrete or interconnected. These devices and device structures may be for computation, transmission, storage or display of information, such as logic devices, memory devices, switches or display devices.

When the substrate 106 is an electrical insulating material, the insulating material can be an organic insulator, an inorganic insulator or a combination thereof including multilayers. These electrical insulating materials may be part of a device, or devices or structures, which may be discrete or interconnected. These devices and structures may be for logic applications or memory applications.

When the substrate 106 is an electrically conducting material, the substrate may include, for example, polysilicon, an elemental metal, an alloy including at least one elemental metal, a metal silicide, a metal nitride or combinations thereof including multilayers.

Figure 2:
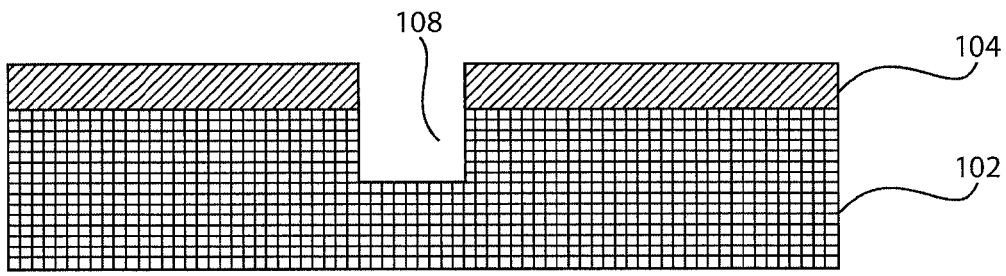
FIG. 2 is cross-sectional view of the dielectric substrate of FIG. 1 having a recess formed in the two dielectric layers in accordance with one embodiment.

Referring to FIG. 2, a recess 108 is formed through layer 104 and into layer 102 to a predetermined depth. The predetermined depth is determined to be sufficient to form a bottom gate electrode as will be described in later steps. The recess 108 may be formed by applying a resist (not shown) over layer 104, exposing the resist to irradiation and developing the resist material to open up regions where the recess (recesses) 108 will be formed.

The resist is patterned using lithographic methods (masks, etc.). After exposure and post-exposure baking, latent images or patterns are developed into relief images or patterns with an appropriate developer, usually an aqueous based solution, such as, e.g., 0.26N tetramethylammoniahydroxide (TMAH) solution. The remaining resist pattern is then employed as a mask for an etching step. The etching preferably includes a reactive ion etch capable of etching the materials of both layers 104 and 102. Alternately, the etchants may be changed to etch both layers 102 and 104 in succession.

Figure 3:
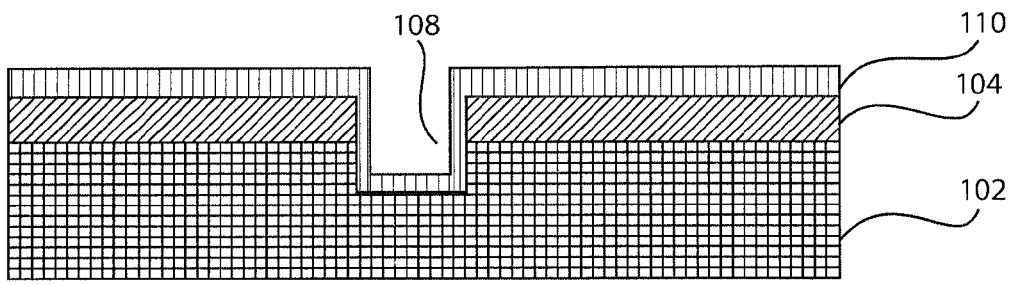
FIG. 3 is cross-sectional view of the dielectric substrate of FIG. 2 having a spacer dielectric foamed in the recess in accordance with one embodiment.

Referring to FIG. 3, a dielectric spacer layer 110 is deposited conformally on layer 104 and in recess 108. The deposition process may include a chemical vapor deposition process or other process capable of conformally depositing layer 110. The dielectric layer 110 may include a silicon nitride layer although other dielectric materials may also be employed.

Figure 4:
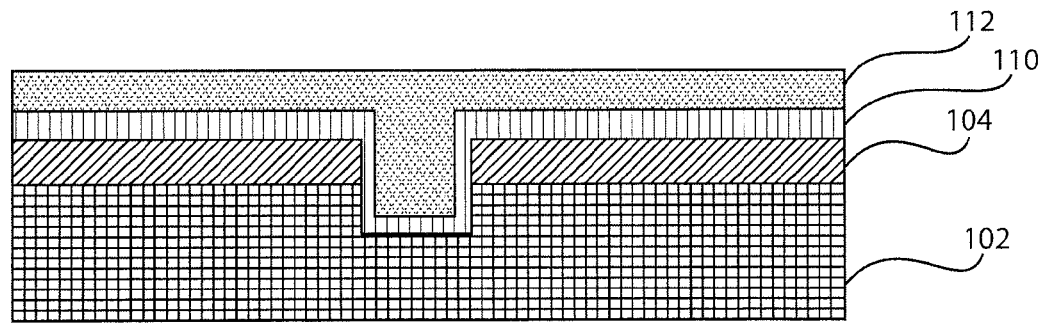
FIG. 4 is cross-sectional view of the dielectric substrate of FIG. 3 having a conductive material formed in the spacer dielectric within the recess in accordance with one embodiment.

Referring to FIG. 4, a conductive layer 112 is deposited in recess 108 and over layer 110. Conductive layer 112 may include copper, aluminum, tungsten, titanium, doped polysilicon or any other useful conductive material, or alloys/combinations thereof. The conductive layer 112 may be deposited using chemical vapor deposition (CVD) or other deposition techniques.

Figure 5:
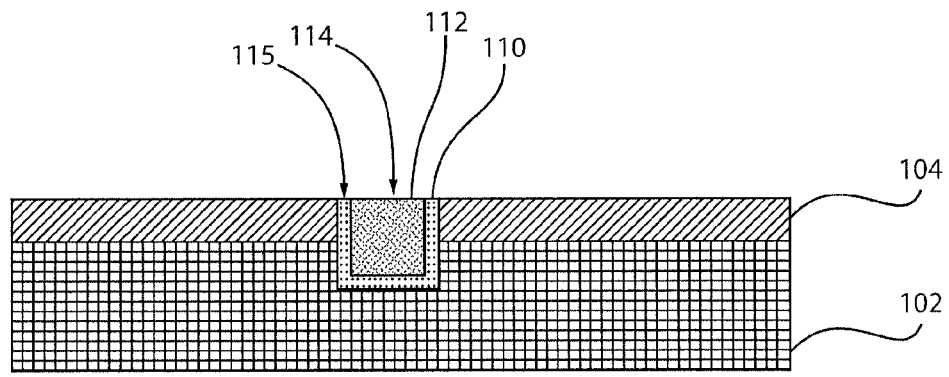
FIG. 5 is cross-sectional view of the dielectric substrate of FIG. 4 having the conductive material and the spacer dielectric planarized to form a buried/bottom gate electrode in accordance with one embodiment.

Referring to FIG. 5, a planarization process is performed to remove excess conductive material of conductive layer 112 from a top of layer 110, and to remove layer 110 from a top of layer 104. This leaves a conductive material forming a bottom gate electrode 114 surrounded on walls and a bottom by a dielectric spacer 115. The planarization process may include a chemical mechanical polish (CMP) or a wet or dry etching processes which may be performed in stages to remove appropriate portions of the conductive layer 112 and the dielectric layer 110 without notable damage to other layers and structures.

Figure 6:
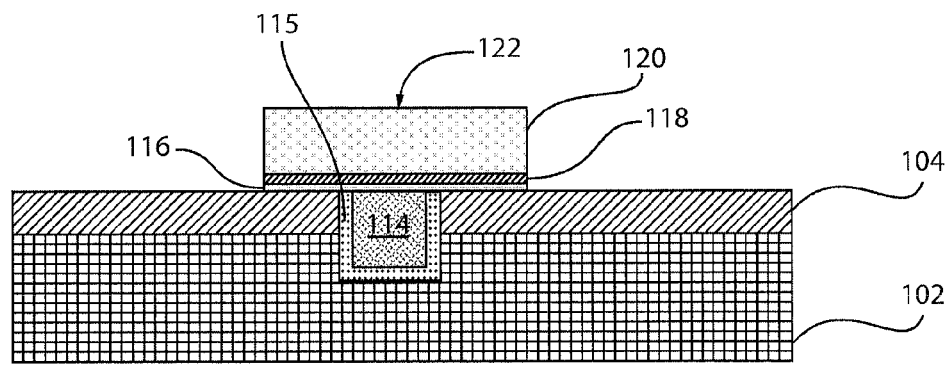
FIG. 6 is cross-sectional view of the dielectric substrate of FIG. 5 having a high-k dielectric layer, a carbon-based semiconductor layer and a cap/protection layer patterned in a stack over the buried gate electrode in accordance with one embodiment.

Referring to FIG. 6, a high dielectric constant (high-k) layer 116 is formed over the surface of layer 104 and over bottom gate electrode 114 and spacer 115. The high-k layer 116 preferably includes a dielectric constant of about 3.9 or greater. The dielectric constant is a measure of how much charge a material can hold. Different materials similarly have different abilities to hold charge. Air is the reference point for this constant and has a "k" of one. High-k materials for layer 116 may include, e.g., hafnium dioxide ($HfO_2$), zirconium dioxide ($ZrO_2$) and titanium dioxide ($TiO_2$), or other suitable materials.

A carbon-based layer 118 is deposited on the high-k dielectric layer 116. By forming the carbon-based layer 118 on the high-k layer 116 as a blanket deposition, the lack of adhesion between these materials is reduced and becomes less of an issue. In fact, in accordance with the present principles, even if adhesion between layers 118 and 116 is not fully achieved, the resulting transistor device is still operational and can function within specifications. The carbon-based layer 118 may include carbon nanotubes, carbon nanoribbons, graphene or other semiconducting elemental materials or field effect materials. The carbon nanotubes may include single or multilayered structures.

While techniques for producing carbon nanotubes may include arc discharge, laser ablation and high pressure carbon monoxide (HiPco)—chemical vapor deposition (CVD) and plasma enhanced CVD are preferred methods. During CVD, a layer of metal catalyst particles, most commonly nickel, cobalt, iron, or a combination is formed. The metal nanoparticles can also be produced by, e.g., including a reduction of oxides or oxide solid solutions. The diameters of the nanotubes that are to be grown are related to the size of the metal particles. This can be controlled by patterned (or masked) deposition of the metal, annealing, or by plasma etching of a metal layer.

In one embodiment, the substrate layers are heated to approximately 700° C. To initiate the growth of nanotubes, two gases are provided into a reactor. These may include a process gas (such as, e.g., ammonia, nitrogen or hydrogen) and a carbon-containing gas (such as, e.g., acetylene, ethylene, ethanol or methane). Nanotubes grow at the sites of the metal catalyst. The carbon-containing gas is broken apart at the surface of the catalyst particle, and the carbon is transported to the edges of the particle, where it forms the nanotubes. The catalyst particles can stay at the tips of the growing nanotube during the growth process, or remain at the nanotube base, depending on the adhesion between the catalyst particle and the substrate.

In one CVD method, the metal nanoparticles are mixed with a catalyst support, such as MgO or $Al_2O_3$, to increase the surface area for higher yield of the catalytic reaction of the carbon feedstock with the metal particles. If a plasma is generated by the application of a strong electric field during the growth process (PECVD), then the nanotube growth will follow the direction of the electric field.

Once the carbon-based layer 118 is formed a protection layer 120 is deposited over the carbon-based layer 118. The protection layer 120 may include any suitable dielectric layer. In one embodiment, the protection layer 120 includes a dielectric material that permits etching of layer 104 and layer 124 (FIG. 7), such as, SiN, although organic dielectrics, SiC, SiON, etc. may also be employed.

A resist layer (not shown) is formed on the protection layer 120. The resist layer is exposed to irradiation through a lithographic mask and developed to provide a patterned mask (not shown). Lithographical processing steps are known in the art. The mask is employed to etch through the protection layer 120, the carbon-based layer 118 and the high-k dielectric layer 116 to form a stack 122, which extends over and beyond the bottom gate electrode 114 and spacer 115. The carbon-based layer 118 forms a channel region for a transistor device that will be completed as described hereinafter.

Figure 7:
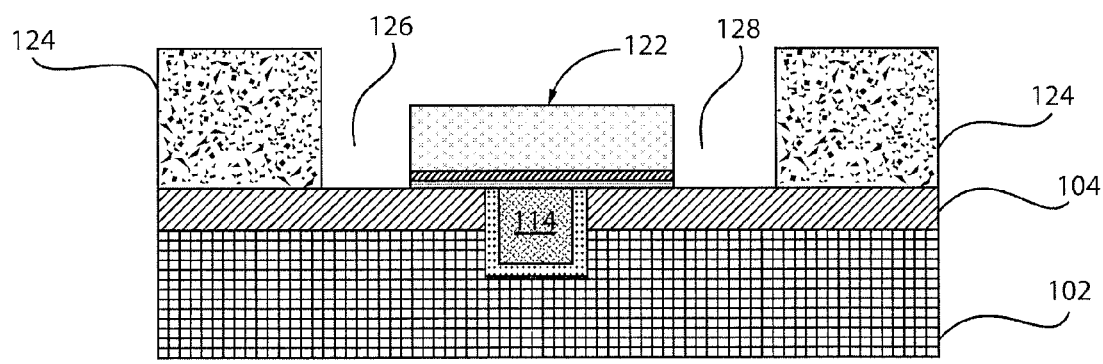
FIG. 7 is cross-sectional view of the dielectric substrate of FIG. 6 having an isolation dielectric layer opened over a transistor area (over the stack) in accordance with one embodiment.

Referring to FIG. 7, an isolation dielectric layer 124 is deposited over the stack 122 and over the layer 104. The dielectric layer 124 may be any dielectric material, but should permit selective etching with respect to protection layer 122 and layer 104.

The dielectric layer 124 may be formed utilizing a conventional deposition process such as, for example, chemical vapor deposition (CVD), plasma enhanced chemical vapor deposition (PECVD), atomic layer deposition (ALD), chemical solution deposition (such as spin coating), or evaporation. The dielectric layer 124 may include any suitable dielectric capping material such as, for example, SiC, SiN, $SiO_2$, a carbon doped oxide, a nitrogen and hydrogen doped silicon carbide SiC(N,H) or multilayers thereof. In one embodiment, layer 124 includes SiN, although other dielectric materials may be employed.

Dielectric layer 124 is opened up over the stack 122 and in regions 126 and 128 which will become sites for forming source and drain regions for a transistor device to be formed. The dielectric layer 124 is opened up using a lithographically formed mask of resist or other layer. An etch process such as a reactive ion etch (RIE) maybe employed to etch down to the protection layer 120 and layer 104, as depicted.

Figure 8:
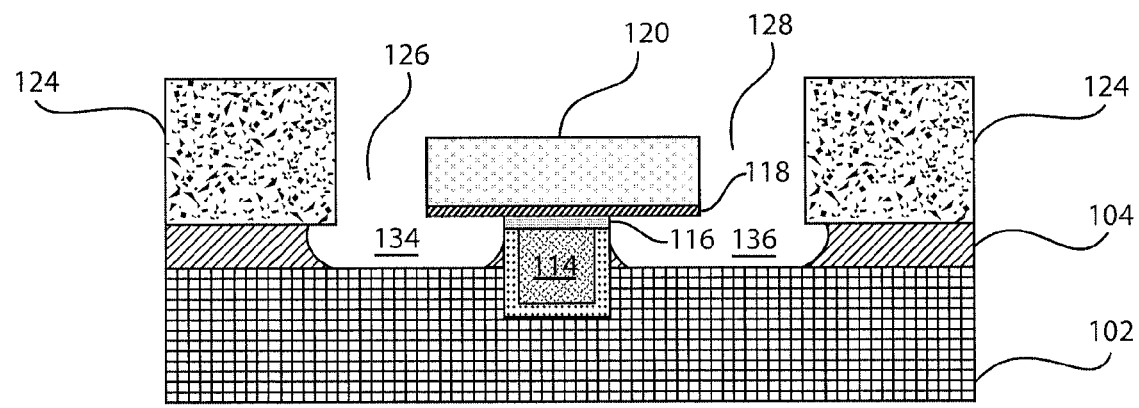
FIG. 8 is cross-sectional view of the dielectric substrate of FIG. 7 having cavities formed on opposite sides of the buried gate electrode in accordance with one embodiment.

Referring to FIG. 8, a RIE process is performed to etch away layer 104 in recesses 126 and 128 down to layer 102.

This is followed be a wet etch to further remove layer 104 and etch back the high-k dielectric layer 116 to the spacer 115 to form cavities 134, 136. The wet etch may include aqueous solutions of HCL, HF or other wet etchants as needed.

Figure 9:
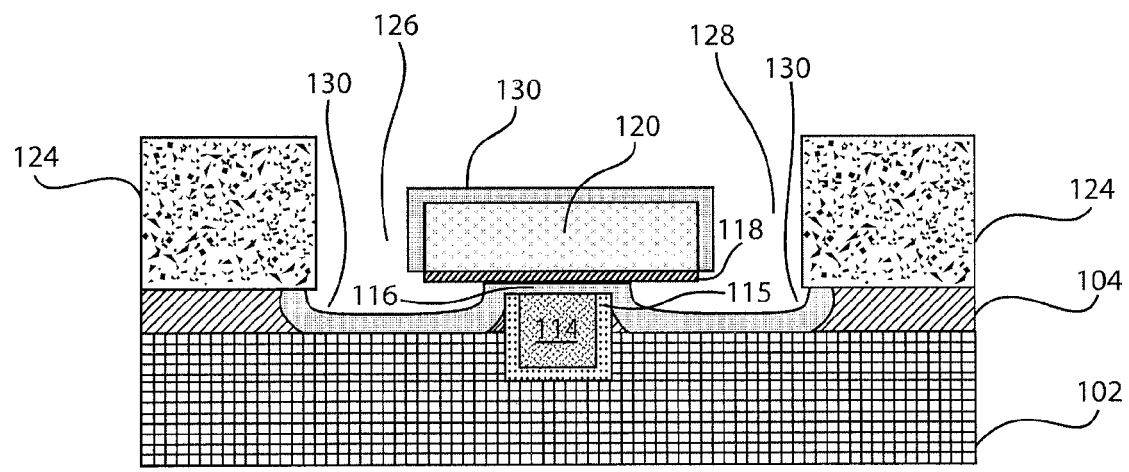
FIG. 9 is cross-sectional view of the dielectric substrate of FIG. 8 having an optional high-k dielectric refill layer to reduce an undercut below the carbon-based layer in accordance with another embodiment.

Referring to FIG. 9, an optional deposition of a high-k material 130 may be performed to refill the undercut in the high-k dielectric layer 116 near spacer 115. The deposition of material 130 provides an encapsulation layer that covers the protection layer 120 and lines lower portions of cavities 134, 136 associated with recesses 126 and 128. The deposition may be performed using, e.g., an atomic layer deposition (ALD), which is a thin film deposition technique that is based on the sequential use of a gas phase chemical process. An ALD reaction may employ chemicals, called precursors, which react with a surface one-at-a-time in a sequential manner. By exposing the precursors to the growth surface repeatedly, a thin film is deposited. The high-k dielectric material 130 may include hafnium dioxide, zirconium dioxide, titanium dioxide, etc.

Figure 10:
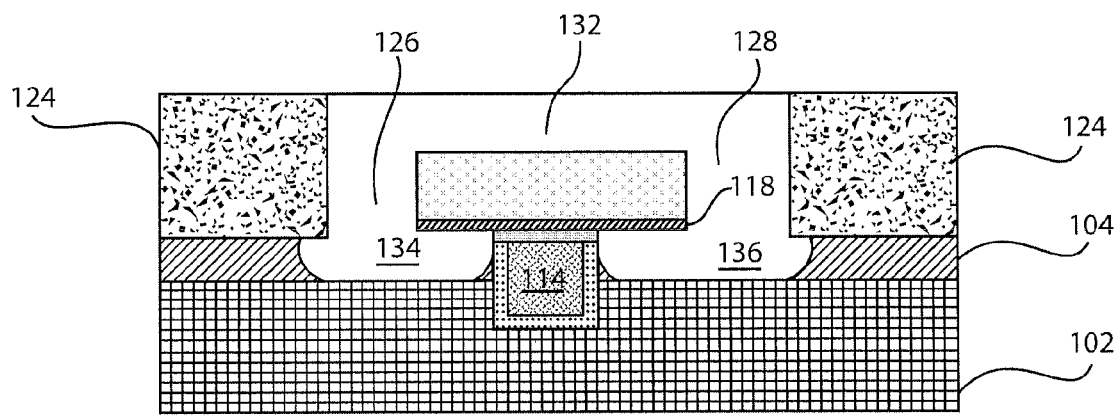
FIG. 10 is cross-sectional view of the dielectric substrate of FIG. 8 having a source/drain conductor formed in the cavities that is self-aligned with the carbon-based layer in accordance with one embodiment.

Referring to FIG. 10, a conductive material 132 is deposited in recesses 126 and 128 and fills cavities 134 and 136. The deposited conductive material 132 also forms on a top surface of the layer 124. The deposition process may include an ALD process or other processes capable of filing cavities. The conductive material 132 may include copper, aluminum, tungsten, titanium, doped polysilicon or any other useful conductive material, or alloys/combinations thereof. The deposition process provides conductive material 132 for the formation of source and drain regions of a transistor device. The material 132 for the source and drain regions is in contact and automatically aligned with surfaces of the carbon-based layer 118. The conductive material 132 is therefore self-aligned with respect to the transistor device having a buried gate electrode 114 arrangement in accordance with one aspect of the present principles.

A planarization process is performed to reduce excess conductive material 132 on a surface of layer 124. The planarization process preferably includes a CMP process, although other processes may be employed.

Figure 11:
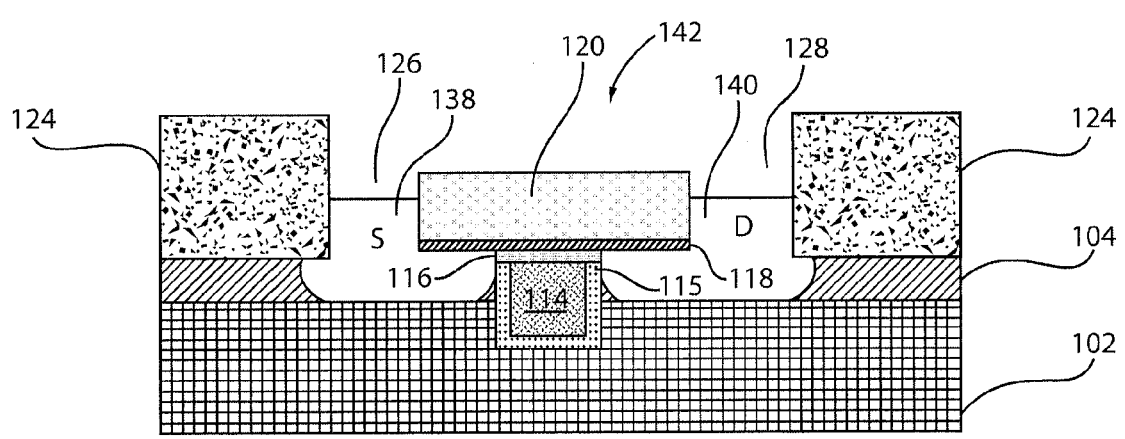
FIG. 11 is cross-sectional view of the dielectric substrate of FIG. 10 having self-aligned source/drain regions formed in the cavities in accordance with one embodiment.

Referring to FIG. 11, source (S) and drain (D) regions 138 and 140 are formed by etching the conductive material 132 below the protection layer 120 within recesses 126 and 128. The source and drain regions 138, 140, work with buried gate electrode 114 and carbon-based layer 118 to from a transistor device 142. The etching process may include a wet or a dry etch. A wet etch process may be preferred and may include any etchant that selectively etches the conductive materials 132 without significant damage to the surrounding materials or structures.

Additional processing includes forming contacts to source and drain regions 138, 140, forming interlevel dielectrics, forming metal lines, etc. to provide fully functioning transistor structures.

Figure 12:
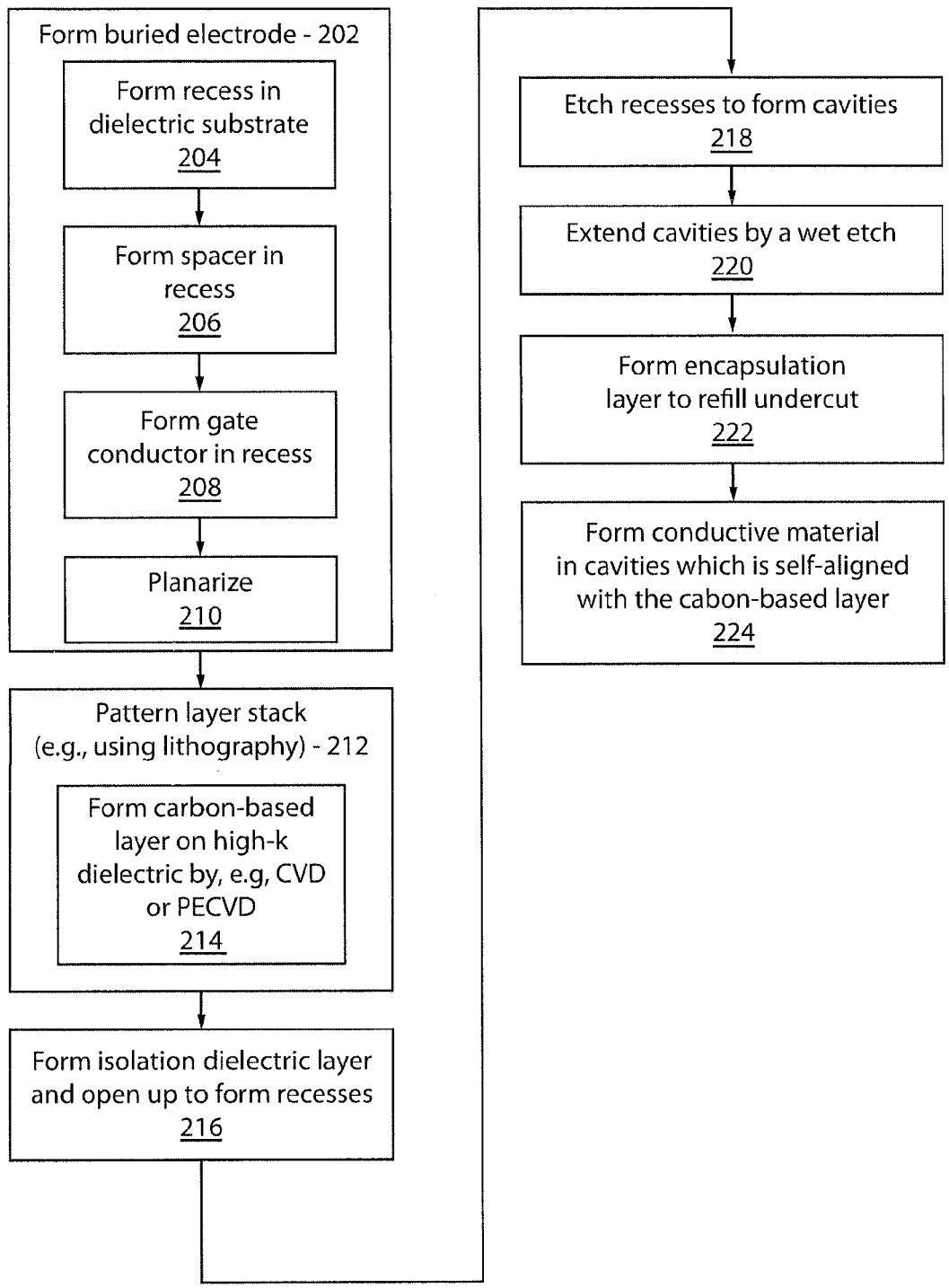
FIG. 12 is a block/flow diagram showing a method for fabricating a carbon-based transistor with self-aligned source and drain regions in accordance with the present principles.

Referring to FIG. 12, a method for fabrication of a carbon-based device with self-aligned source and drain regions is illustratively described. In block 202, a buried gate electrode is formed in a dielectric substrate. Forming the buried gate may include forming a recess through a first dielectric material of the substrate and into a second dielectric material of the substrate in block 204. A dielectric spacer is formed in the recess in block 206. A gate electrode conductor is deposited over the spacer in the recess in block 208. A planarization step is preferably performed in block 210 to remove excess conductor and spacer material from a top surface of the substrate.

In block 212, a stack of layers is patterned over the buried gate electrode. The stack is preferably patterned by employing a lithographic process to form an etch mask. The stack is etched to provide the stack over the buried gate electrode. The stack includes a high dielectric constant layer, a carbon-based semi-conductive layer and a protection layer. The high dielectric constant layer includes a dielectric layer having a dielectric constant greater than 3.9. This may include, e.g., one or more of hafnium dioxide, zirconium dioxide and titanium dioxide, etc.

The carbon-based layer may be deposited by a chemical vapor deposition (CVD) or a plasma enhanced chemical vapor deposition (PECVD) process in block 214. The carbon-based layer is preferably deposited directly on the high dielectric constant layer. The carbon-based layer may include carbon nanotubes, carbon nanoribbons, a graphene layer or other suitable carbon structures.

In block 216, an isolation dielectric is deposited over the stack and substrate. The area around the stack is opened up by masking and etching the isolation dielectric layer to open up the isolation dielectric layer to define recesses in regions adjacent to the stack. In block 218, the recesses are then further etched (e.g., RIE) to form cavities. This includes etching the first dielectric layer down to the second dielectric layer to form the cavities. In block 220, the cavities are further etched (e.g., wet etched) to expand the cavities below the stack and below the isolation dielectric layer, as desired. This wet etch removes a portion of the high dielectric constant layer to expose the carbon-based layer on opposite sides of the buried gate electrode. In block 222, an encapsulation layer formed from a high dielectric constant material may be deposited in the cavities to refill an undercut formed by the wet etching.

In block 224, a conductive material is deposited in the cavities to form self-aligned source and drain regions. This may include depositing the conductive material by employing atomic layer deposition (ALD) to form the conductive material in contact with the carbon-based layer. Excess conductive material may be removed from a surface of the isolation layer by CMP and further etched down to the protection layer. Further processing may be performed to complete the electrical connections to the device, etc.

Having described preferred embodiments for a carbon device with self-aligned source and drain regions (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a device, comprising:
   forming a buried gate electrode in a dielectric substrate;
   patterning a stack comprising a high dielectric constant layer, a carbon-based layer and a protection layer over the buried gate electrode;
   opening an isolation dielectric layer formed over the stack to define recesses in regions adjacent to the stack;
   etching the recesses to form cavities and remove a portion of the high dielectric constant layer to expose the carbon-based layer on opposite sides of the buried gate electrode; and
   depositing a conductive material in the cavities to form self-aligned source and drain regions.

2. The method for fabricating a device according to claim 1, wherein forming a buried gate electrode in a dielectric substrate includes:
forming a recess through a first dielectric material of the substrate and into a second dielectric material of the substrate;
forming a dielectric spacer in the recess; and
depositing a gate electrode conductor over the spacer in the recess.

3. The method for fabricating a device according to claim 1, wherein patterning the stack includes depositing one or more of hafnium dioxide, zirconium dioxide and titanium dioxide to form the high dielectric constant layer.

4. The method for fabricating a device according to claim 1, wherein patterning the stack includes depositing a dielectric layer having a dielectric constant greater than 3.9 to form the high dielectric constant layer.

5. The method for fabricating a device according to claim 1, wherein patterning the stack includes employing a lithographic process to form an etch mask, and etching the stack to provide the stack over the buried gate electrode.

6. The method for fabricating a device according to claim 1, wherein patterning the stack includes depositing the carbon-based layer by a chemical vapor deposition (CVD) or a plasma enhanced chemical vapor deposition (PECVD) process.

7. The method for fabricating a device according to claim 1, wherein patterning the stack includes forming the carbon-based layer directly on the high dielectric constant layer.

8. The method for fabricating a device according to claim 1, wherein the substrate includes a first dielectric material and a second dielectric material, and the step of etching the recesses to form cavities and remove a portion of the high dielectric constant layer includes etching the first dielectric layer down to the second dielectric layer to form the cavities.

9. The method for fabricating a device according to claim 8, further comprising wet etching the cavities to remove the portion of the high dielectric constant layer to expose the carbon-based layer.

10. The method for fabricating a device according to claim 9, further comprising depositing an encapsulation layer formed from a high dielectric constant material in the cavities to refill an undercut formed by the wet etching.

11. The method for fabricating a device according to claim 1, wherein depositing a conductive material in the cavities to form self-aligned source and drain regions includes depositing the conductive material by employing atomic layer deposition to form the conductive material in contact with the carbon-based layer.

12. The method for fabricating a device according to claim 1, wherein the carbon-based layer includes one of carbon nanotubes, carbon nanoribbons and a graphene layer.

13. A method for fabricating a device, comprising:
forming a recess through a first dielectric material of a substrate and into a second dielectric material of the substrate;
forming a dielectric spacer in the recess;
depositing a gate electrode conductor over the spacer in the recess;
planarizing the gate electrode conductor and the dielectric spacer to remove access materials above the recess to form a buried gate electrode in the substrate;
forming a stack comprising a high dielectric constant layer, a carbon-based layer and a protection layer;
employing a lithographic process to form an etch mask and etching the stack to provide a portion of the stack over the buried gate electrode;
opening an isolation dielectric layer formed over the stack to define recesses in regions adjacent to the stack;
etching the recesses to form cavities and remove a portion of the high dielectric constant layer to expose the carbon-based layer on opposite sides of the buried gate electrode; and
depositing a conductive material in the cavities to form self-aligned source and drain regions by employing atomic layer deposition to form the conductive material in contact with the carbon-based semi-conducting layer.

14. The method for fabricating a device according to claim 13, wherein patterning the stack includes depositing a dielectric layer having a dielectric constant greater than 3.9 to form the high dielectric constant layer.

15. The method for fabricating a device according to claim 13, wherein forming the stack includes depositing the carbon-based layer by a chemical vapor deposition (CVD) or a plasma enhanced chemical vapor deposition (PECVD) process.

16. The method for fabricating a device according to claim 13, wherein etching the recesses to form cavities includes etching the first dielectric layer down to the second dielectric layer to form the cavities.

17. The method for fabricating a device according to claim 16, further comprising wet etching the cavities to remove the portion of the high dielectric constant layer to expose the carbon-based layer.

18. The method for fabricating a device according to claim 17, further comprising depositing an encapsulation layer formed from a high dielectric constant material in the cavities to refill an undercut formed by the wet etching.

* * * * *